United States Patent [19]

Arditty et al.

[11] Patent Number: 4,542,338
[45] Date of Patent: Sep. 17, 1985

[54] OPTICAL FIBRE INTERFEROMETRIC ELECTRIC CURRENT MEASURING DEVICE

[75] Inventors: Hervé Arditty; Michel Rollin, both of Paris, France

[73] Assignee: Thomson-CSF, Paris, France

[21] Appl. No.: 473,537

[22] Filed: Mar. 9, 1983

[30] Foreign Application Priority Data

Mar. 12, 1982 [FR] France ............... 82 04222
May 14, 1982 [FR] France ............... 82 08482

[51] Int. Cl.⁴ .................................... G01R 19/00
[52] U.S. Cl. ....................... 324/117 R; 324/96
[58] Field of Search ........... 324/117 R, 96; 350/355, 350/356; 332/7.51

[56] References Cited

U.S. PATENT DOCUMENTS 3,964,020 6/1976 Dickerson ................. 324/96
4,370,612 1/1983 Puech et al. .............. 324/96

FOREIGN PATENT DOCUMENTS 0023180 1/1981 European Pat. Off. .
2433432 1/1976 Fed. Rep. of Germany .
2716922 10/1978 Fed. Rep. of Germany .
2901872 7/1980 Fed. Rep. of Germany .
2098233 3/1972 France .
2258633 8/1975 France .
2461956 1/1981 France .

*Primary Examiner*—Ernest F. Karlsen
*Attorney, Agent, or Firm*—Oblon, Fisher, Spivak, McClelland & Maier

[57] ABSTRACT

Optical fibre interferometer for measuring a current carried by a high voltage line of the type comprising a winding traversed by a feedback current, having at least one base at earth potential, incorporating the interferometer core and the feedback winding, an insulating member and a measuring head mounted on a conductor traversed by the current to be measured. The insulating member is a rigid member forming a support or, in a preferred variant, a tubular insulating member having a flexible wall and provided with skirts made from an insulating material with a rounded "water droplet" profile.

22 Claims, 13 Drawing Figures

OPTICAL FIBRE INTERFEROMETRIC ELECTRIC CURRENT MEASURING DEVICE

BACKGROUND OF THE INVENTION

The present invention relates to the field of the measurement of electric currents and more particularly those having very high intensities carried by high voltage lines.

In certain environments, particularly in electric power stations or electrochemical planes, it is very difficult to use conventional measuring devices for measuring currents having high intensities and liable to vary considerably. Thus, in such environments, the high voltages, high temperatures, possibly corrosive atmosphere, electromagnetic pollution or difficult accessibility make measurements difficult and unreliable when carried out by conventional e.g. Hall effect gauge or shunt means. Thus, in the case of measuring currents of a few hundred thousand amperes, shunt-type current measuring devices only make it possible to obtain an accuracy of about 10% on the measured value and they also lead to energy losses in the measuring device.

For the purpose of improving such devices, it has been proposed to utilize the magnetooptical effect manifested, for example, in interferometric devices. As is shown, when a light wave propagates parallel to the lines of force of a magnetic field, the latter induces a non-reciprocal effect or Faraday effect on the wave.

U.S. patent application Ser. No. 171,285 of July 23rd 1980, now U.S. Pat. No. 4,370,612, relates to an optical fibre electric current measuring interferometer of this type. The device described in this patent application has an optical fibre wound around the conductor in which circulates the current to be measured, a laser source, means for separating the radiation emitted by the source and feeding it to the two ends of the wound fibre and for recombining the radiation emerging from these two ends, a conductor circuit traversed by a regulatable reference current, and a detector supplying a signal which is characteristic of the interferences between the two waves emerging from the fibre, the reference current being adjusted so that the phase shift between the two contrarotating waves in the fibre is zero, said current then being proportional to the current to be measured and circulating in the main conductor.

However, on measuring currents carried by high or very high voltage power lines, where the voltages reach 220 or even 400 kV, the insulation distances in air are respectively 2.5 and 4.5 m. Therefore it is not possible to merely surround the conductor carrying the current with one or more turns of the interferometer optical fibre and arrange in the vicinity thereof the electronic circuits supplying the regulatable reference current.

Other difficulties also occur. More specifically the aforementioned device acts as a current divider. The electronic circuits adjust the current in the feedback winding, so as to cancel out the effect of the current passing through the main loop on the phase of the light guided by the fibre. The two currents are then proportional to the number of turns in the windings only if the magnetooptical interaction coefficient is the same for both windings, one of them being reduced to its simplest expression, because it is a power transmission cable.

When these two windings are not superimposed, which is generally the case, it is not possible to apply Ampere's law, which guarantees this equality, is only possible if the polarization state of the light transferred is uniform along the closed path of the interferometer fibre.

No fibre perfectly retains the circular polarization state necessary for this operation. When, as is the case in very high voltage, it is necessary to move the feedback loop a considerable distance from the main current conductor in order to prevent a breakdown, the stability of the scaling factor can be considerably affected and the measurement is then falsified.

BRIEF SUMMARY OF THE INVENTION

The object of the present invention is to obviate the difficulties encountered with the prior art devices.

The present invention therefore specifically relates to a device for measuring at least one current circulating in a power distribution line raised to a high potential compared with earth potential, of the type using at least one interferometric measuring means comprising an optical fibre in which circulate two waves in opposite directions, the current to be measured inducing a first phase shift between the two waves emerging at the ends of the optical fibre by the Faraday effect, optoelectronic circuits supplying an electric control signal proportional to this phase shift and a reference current generator supplying a reference conductor circuit inducing by the Faraday effect a second phase shift between the two waves emerging at the ends of the optical fibre in the opposite direction to the first phase shift and, of amplitude such that the resulting phase shift is zero, the reference current value being directly proportional to the current to be measured, comprising for each current to be measured, a measuring head made from an insulating material and placed on a conductor through which the current to be measured flows, whilst associated with each measuring head there is an element made from an insulating material and perforated by a connecting channel, one of the ends of said channel issuing into the measuring head, and a base raised to earth potential incorporating the reference circuit and linked with the second end of the channel made in the insulating element, the optical fibre of each interferometric measuring means being disposed in such a way as to form at least one closed loop describing a path starting in the base, traversing the channel in a first direction, forming a turn around the conductor within the measuring head, passing through the channel again in the opposite direction and returning to the base in order to form at least one turn around the reference conductor circuit.

BRIEF DESCRIPTION OF THE DRAWINGS

The invention is described in greater detail hereinafter relative to non-limitative embodiments and the attached drawings, wherein show:

FIGS. 12 and 13 the application of the device according to the invention to the measurement of polyphase currents.

DETAILED DESCRIPTION OF THE PREFERRED EMBODIMENTS

Figure 1:
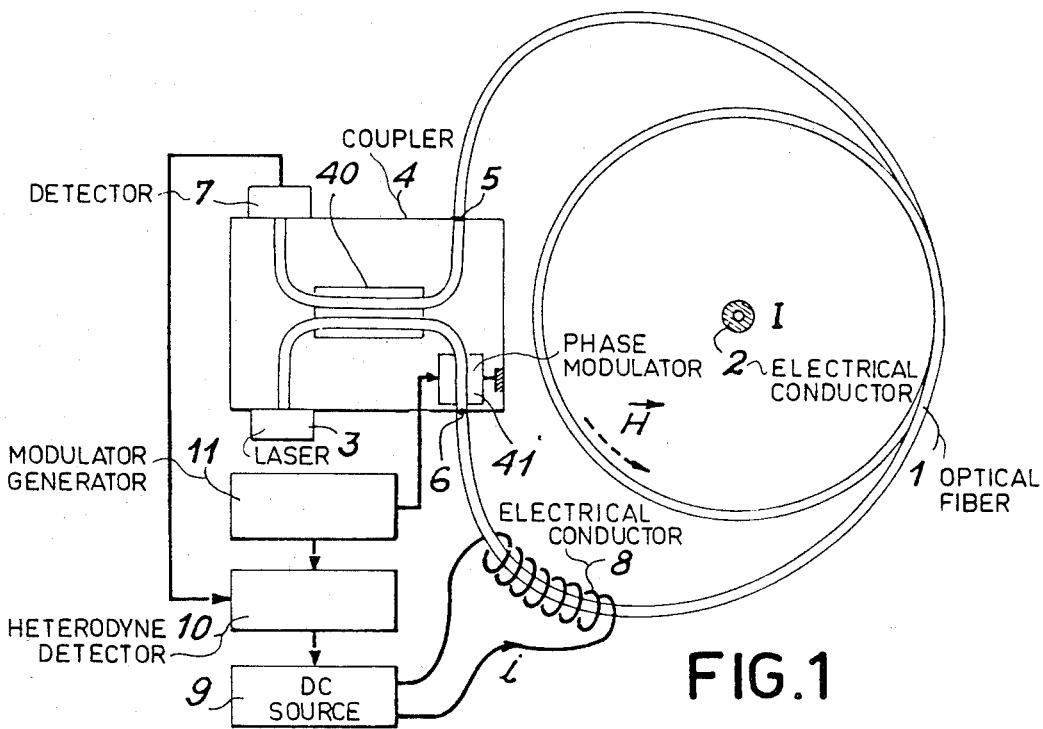
FIGS. 1 to 3 a prior art current measuring interferometer.

The device according to the invention constituting a current measuring means incorporating an optical fibre interferometer will now be described. The current circulating in a conductor induces a magnetic field around the latter. If a light wave propagates in a medium surrounding said conductor, the magnetic field induces by the magnetooptical effect variations in the propagation conditions of the light wave. When the magnetic field and the propagation direction of the light wave are parallel, the magnetooptical effect induced on the light wave is a non-reciprocal or Faraday effect, which is dependent on the propagation direction of the wave relative to the direction of the magnetic field.

To demonstrate by this non-reciprocal effect, a measurable quantity directly linked with the current circulating in the conductor and which consequently does not integrate other effects and particularly reciprocal effects which also produce variations in the propagation conditions (temperature variation or pressure variation), the measuring means uses two waves rotating in opposite directions in the same propagation medium surrounding the conductor. In the same way, these two waves undergo reciprocal effects inducing in the said medium variations in the propagation conditions which vary in the same direction and as a result of the Faraday effect undergo variations in opposite directions. The latter can be detected by an interferometric method.

For this purpose, the current measuring means incorporates an optical fibre wound round the conductor in which the current I to be measured circulates, said fibre having one or more turns, the two ends of the wound optical fibre receiving in each case an optical wave e.g. from a laser, said two waves circulating in opposite directions in said fibre. The current circulating in the conductor induces a magnetic field in the same direction as the propagation direction of one of the waves and in the opposite direction to the other. The two waves emerging from the fibre have a phase shift $\Delta\phi$, which depends on Verdet's constant characterizing the Faraday effect of the propagation medium, the intensity I of the current circulating in the conductor, (optionally of the number q of conductors when the optical fibre surrounds several branches of the conductor in which the same current I circulates), and the number m of turns of the optical fibre around the conductor.

To show the phase shift between the two waves, the measuring means has an interferometric structure, the two contrarotating waves emerging from the ends of the fibre being recombined and the corresponding signals being detected by a photodetector.

Bearing in mind the different constants, involved in the device and the variations in time liable to occur, it is very difficult to obtain accurate information on the scaling factor of such a measuring device, i.e. the relationship linking the intensity I of the current circulating in the conductor and the light intensity L detected on the photodetector. Thus, according to preferred construction modes, the measuring means employs a zero method for performing this measurement. For this purpose the optical fibre and consequently the optical wave are subject to the effects of a reference magnetic field produced by a current i which is well below the current to be measured and traversing a conductor passing through the optical fibre loop a large number of times. Current i is regulatable and is adjusted at all times to compensate the phase shift $\Delta\phi$ induced by current I, by creating a phase shift $\Delta\phi$ induced by the current i.

Numerous constructional variants of the measuring means are possible in the scope of the present invention and, for information purposes, a description will now be given of the embodiments shown in FIG. 1, which corresponds to that described with reference to FIG. 5 of U.S. patent application Ser. No. 171,285.

A fibre 1 forms one or more turns around a conductor 2, depending on the current range to be measured. A light beam from a laser 3 is simultaneously coupled to the two ends of the fibre 1 via an optical separation and coupling circuit 4. The two light waves circulate in the fibre in opposite directions and emerge from the two ends 5 and 6 to be recombined in the optical separation and coupling circuit. The radiation resulting from the mixing of the emergent waves is detected by a photodetector 7. When conductor 2 is traversed by a current I, it induces a magnetic field $\vec{H}$ along closed lines around said conductor. The circular polarization components of the light wave propagating in the fibre undergo a phase shift induced by the Faraday effect by the magnetic field. It is known that an optical fibre behaves like a stack of random double refracting biplates inducing polarization variations on the propagating light wave. These effects are reciprocal and act in the same way on both contrarotating waves. However, the circular polarization effect for introducing a delay or advance on each of the components acts in different directions on the two contrarotating waves and consequently introduces an overall phase shift $\Delta\phi$. Thus, for each wave, the establishment of the magnetic field parallel to the propagation direction advances the circular vibration in the same direction as the magnetizing current and delays the circular vibration in the opposite direction by an equal quantity. Even if the polarization state of the light wave varies during propagation along the fibre, the delay and advance effects cumulate along said fibre and the two emerging waves have a phase shift which can be detected by interferometry directly representing the effects induced by current I circulating in the conductor, whereas as the two waves undergo the other effects in the same way, they introduce no phase shift between them.

Figure 2:
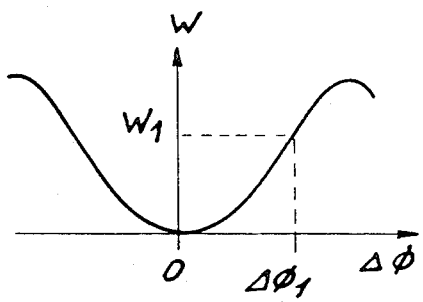

The measuring means shown supplies the detector with a light intensity W varying as a function of the phase shift $\alpha\phi$ between the two contrarotating waves along the curve shown in FIG. 2, the phase shift $\Delta\phi$ being a function of the current I circulating in the conductor. However, due to the variations undergone by the waves in the fibre as a function of time, the scaling factor of said curve is not fixed in time, i.e. the light intensity $W_1$ detected for a fixed induced phase shift $\Delta\phi_1$, due to a given current $I_1$ can vary as a function of time. Thus, this measuring device does not make it possible to supply an absolute measurement of current I.

The measuring means shown in FIG. 1 uses a zero method making it possible to have a reference value i at all times, which is adjusted to produce a phase shift between the two contrarotating waves by Faraday effect, thus exactly compensating the phase shift induced by the current I to be measured, current i then being directly proportional to the current I to be measured. Thus, for this purpose the measuring means has a conductor 8 with p turns surrounding one or more turns of the wound optical fibre 1. Conductor 8 is traversed by a variable current i supplied by a current generator 9. The signal from photodetector 7 corresponding to the interferences between the two contrarotating waves emerging from the fibre, is transmitted to a processing device 10, which supplies the current generator 9 with a control signal, such that at all times the phase shift between the two contrarotating waves is zero.

If K is Verdet's constant of the material forming the fibre, m the number of turns wound round conductor 2, q the number of branches of the conductor surrounded by the wound fibre 1, the phase shift $\Delta\phi_1$ induced by current I circulating in conductor 2 is:

$$\Delta\phi_1 = KmqI \qquad (1)$$

If p is the number of turns of conductor 8 surrounding n turns of optical fibre 1, the phase shift $\Delta\phi_2$ induced by the current i circulating in conductor 8 is:

$$\Delta\phi_2 = Kpni \qquad (2)$$

The processing circuit 10 applies to current generator 9 a control signal, such that at all times $\Delta\phi_1 = \Delta\phi_2$, the phase shift between the two contrarotating waves thus being kept equal to 0 at all times. The value of the current I is then deduced from the value of current i by the relation $I = (pn/mq)i$ Several methods can be used for obtaining a measuring means with a significant reolution. The first not shown method consists of modulating the current circulating in reference conductor 8 and then carrying out a heterodyne detection at the modulation frequency of said current, the signal resulting from this heterodyne detection making it possible to control the continuous component of the current circulating in the conductor. A second method consists of directly modulating the phase of the wave circulating in the optical fibre 1. Once again use is made of the integrated optical circuit 4, which will now be described in greater detail.

The integrated optical circuit 4 is supplied by a semiconductor laser source 3 directly coupled by the edge to the integrated circuit board. A 3 dB coupler 40 makes it possible to separate the light beam from laser source 3 into two integrated optical guide branches, which are respectively coupled to the two ends 5, 6 of the wound optical fibre 1. For detecting the emergent waves after circulation in opposite directions, the device has a detector 7 detecting the radiation resulting from the superimposing of the two waves by coupler 40. The output signal of this detector is applied to a signal processing circuit 10 supplying current generator 9 with a control signal making it possible to vary current i circulating in conductor 8 surrounding the optical fibre.

The integrated optical structure is particularly suitable for modulating the phase of the guided wave, because it is possible to realise in a simple manner a phase modulator placed in the integrated optical circuit of one of the two wave guides located at the output of the 3 dB coupler. This phase modulator 41 is diagrammatically shown in FIG. 1.

The phase shift between the two waves emerging from the two ends of the fibre is modulated to the timing of a frequency ripple F by means of a modulation signal generator. Processing circuit 10 in such a case consequently comprises a heterodyne detector receiving a reference signal at frequency F and supplying a control signal to current generator 9.

In order to make this modulation reciprocal, it is possible to use the same integrated electro-optical phase modulator controlled by a modulation signal of period equal to twice the time taken by the optical wave to pass through the fibre. Thus, when the phase difference between the two contrarotating waves due to the Faraday effect is zero and there is only a phase difference due to the modulation, the detected signal has a component at double the modulation frequency. The detection of this double frequency component which only exists when $\Delta\phi=0$ consequently makes it possible to unambiguously determine the value of the reference current i for which the Faraday effect induced by current I is exactly compensated. In a device comprising discreet elements, it is also possible to modulate the phase of the wave propagating in the fibre loop in a reciprocal manner. For this purpose a phase modulator, which can be obtained by winding a few fibre turns around a piezoelectric ceramic, whose modulation period is equal to twice the passage time in the fibre loop, makes it possible to obtain by detecting the double frequency component, the current i which cancels out the Faraday effect.

Figure 3:
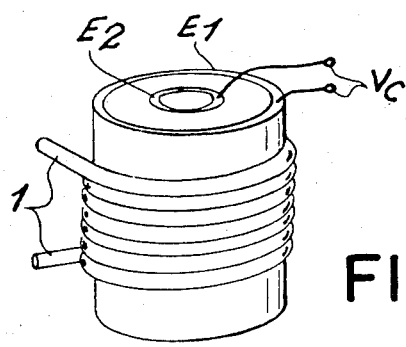

An example of such a phase modulator is diagrammatically illustrated by FIG. 3. The modulator comprises a hollow piezoelectric material cylinder excited by two electrodes $E_1$, $E_2$, respectively arranged on the outer and inner surfaces of the cylinder and receiving the double frequency control signals $V_c$. One of the ends of the fibre forming the interferometer ring has been wound in tight turns. The deformations of the piezoelectric material induced by the periodic signal $V_c$ are transmitted to the optical fibre and have the effect of periodically modulating the phase of the waves flowing in opposite directions in the fibre.

The invention uses an optical fibre interferometer of the type described or a similar type as the basic current measuring means. In particular, the integrated optical circuit 4 can be of some other type or can be replaced by more conventional discreet elements identical to those described relative to FIG. 3 to the aforementioned U.S. Patent Application.

However, as has been stated hereinbefore, when it is a question of measuring currents carried by high or very high voltage lines, the structure of a measuring device cannot be simply derived from the diagrammatic configuration which has just been described. The invention is directed at a structure of the device suitable for such applications.

For information purposes only, reference will be made hereinafter to the fixed measurement of the current carried by 220 or 400 kV lines. The measuring device then serves to replace the current stepdown transformers conventionally used for such applications.

Preferably the device according to the invention comprises the four parts shown in FIG. 4 and as described hereinafter.

(A) The measuring head 12 containing a mandrel, on to which the optical fibre is wound in the manner to be described in greater detail hereinafter. This head has an adequate axial passage to enable it to be mounted on cable 2 in which flows the current to be measured. Cable 2 is surrounded by at least one optical fibre turn in accordance with FIG. 1. This part of the measuring device is at the same potential as line 2, i.e. at a high potential compared with earth.

(B) Support 13 is a generally cylindrical or frustum-shaped part supporting the head of the transducer and protecting the connecting fibres. This member can be produced from an insulator perforated over its length or an end ceramic, which is hollow by its very construction. As a function of the construction procedure, this insulator only supports head 12 or, via said head, supports part of the load of power line 2. Thus, its dimensions are a function of this. In the case of 220 or 400 kV lines, the insulation distances in air are respectively 2.5 and 4.5 m. The length of support 13 must be greater than these values, a length of roughly 5 m being typically used for 400 kV. More generally, the length of the insulating support must be greater than the bending distance of the insulator, which is a function of its geometry.

(C) The base 14 of the device, which is connected to earth potential and serves to support support 13 and protect the feedback winding 8. It can have a random shape and can be made from a random material. It is preferably made from a magnetic metal, e.g. mu-metal, which permits a better decoupling with respect to external magnetic fields liable to cause parasitic phenomena.

(D) An electronic and optical bay 15 connected by a flexible cable having both optical fibres and conductors. It can protect the optical core of the interferometer and the electronics for processing and using the electrical signals.

According to a preferred variant, the optical core of the interferometer is also located in the base of the transducer, which permits joining by a cable 150 only having electrical conductors. Finally, in a not shown variant, electronic bay 15 can coincide with the base 14 of the transducer.

Figure 4:
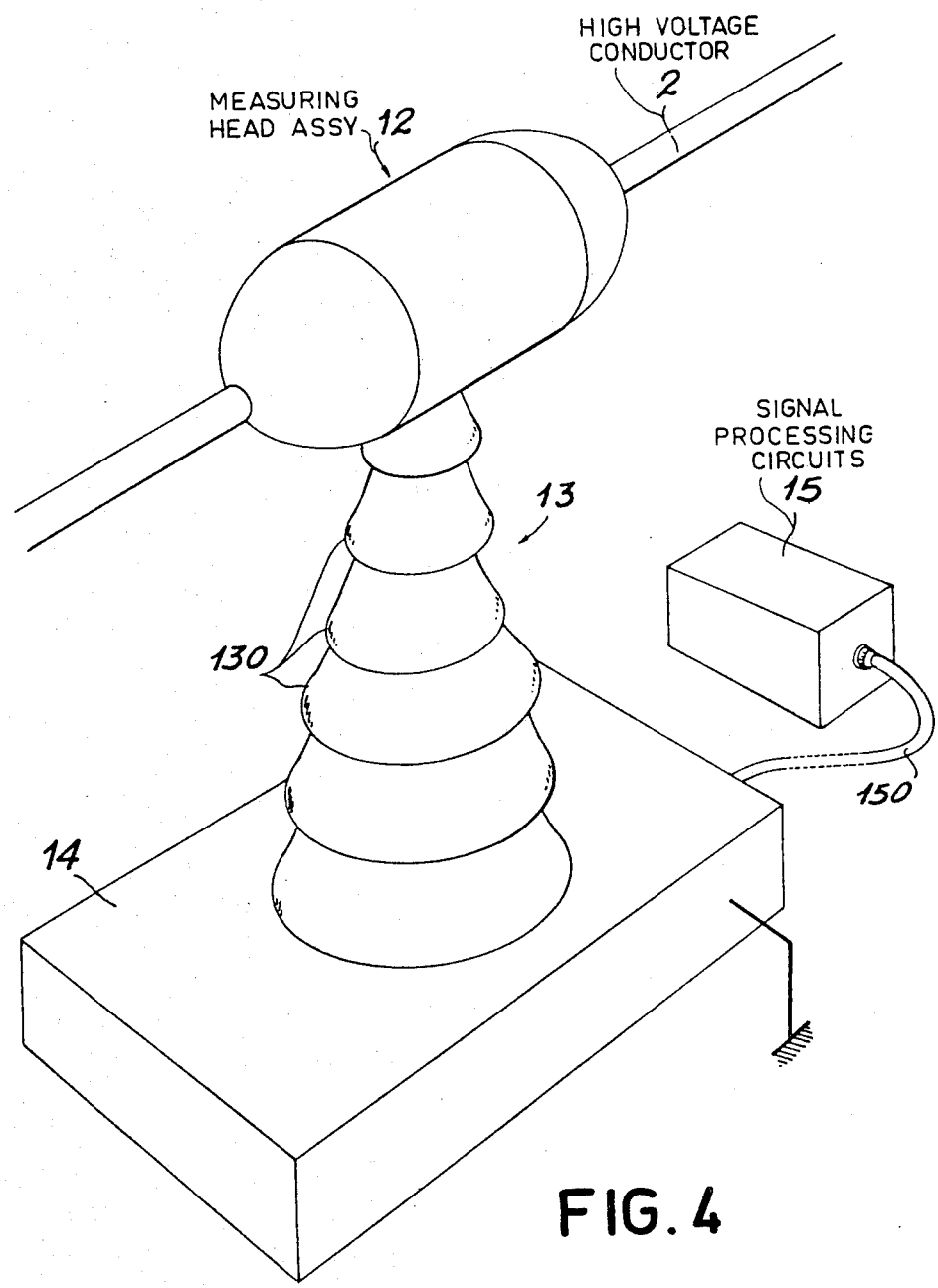
FIG. 4 a specific embodiment of a device according to a first concept of the invention.
Figure 5:
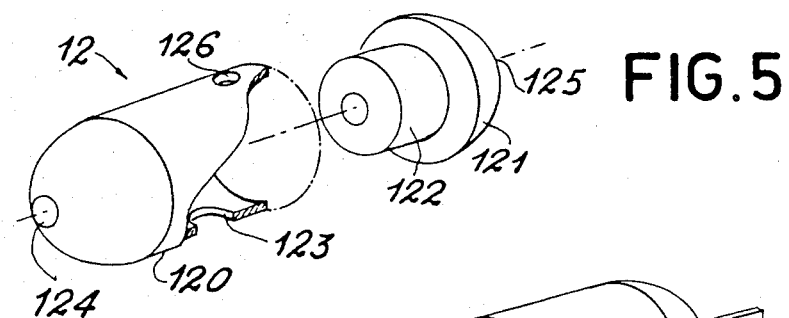
FIGS. 5 to 8 details of special elements used in the device of FIG. 4.

According to a practical embodiment of measuring head 12, shown in part sectional form in FIG. 5, this can be originally constituted by two half-shells 120, 121, which are respectively female and male. The male part has a central mandrel 122 or a similar member on to which is wound at least one turn of the optical fibre 1 (not shown in FIG. 5). The female part has a hole 123, which is mounted on the end of support 13. Each of the two half-shells 121, 122 has an axial channel issuing respectively at ends 124, 125, in such a way that the transducer head can be mounted on cable 2 (FIG. 4).

The two half-shells are then assembled and can be filled through an orifice 116 with an insulating material, e.g. epoxy resin which fixes the assembly. The material forming the half-shells is also an indulating material, e.g. a ceramic material of the same type as that forming the insulating support 13.

The winding diameter of the fibre, i.e. that of mandrel 122, is chosen in such a way that it does not cause an excessive attenuation to the passage of light and so as not to disturb in an exaggerated manner the polarization state (circular) of the light carried.

Measuring head 12 has convex surfaces with large radii of curvature in order to prevent gradients of the electric field liable to cause breakdowns (corona effect). For example, it can be in the form of a cylinder extended at its ends by two hemispheres, as shown in FIGS. 4 and 5, or in the form of a torus, whose axis coincides with cable 2.

Figure 6:
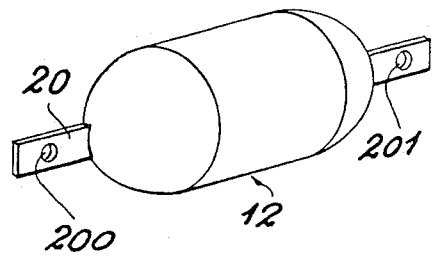

Alternatively, and as shown in FIG. 6, the measuring head 12 can initially have a bar 20 integral therewith and which is inserted in series in the line carrying the current to be measured. Connecting means, represented in FIG. 6 by orifices 200, 201 made in the bar are supplied for this purpose. In this case, the bar can be fixed by bolting.

Figure 7:
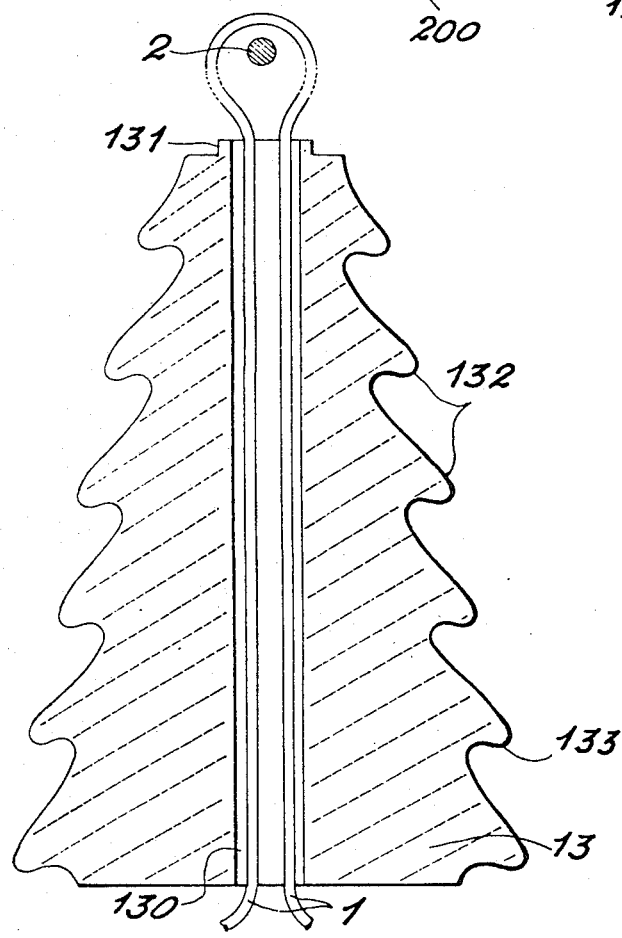

The insulating support 13 is shown in section in FIG. 7. It comprises a channel, e.g. having a circular section 130, in which fibre 1 performs at least one outward and return travel in such a way as to form at least one turn around cable 2. The support is extended via a flange 131, which fits into hole 123 of the measuring head (FIG. 5).

In order to improve the dielectric behaviour and resistance to the environment, the exterior of insulator 13 can have a succession of skirts 132, which increase the length of the leakage path, provided with "water droplets" 133 at the ends. For the same reason, the interior can be filled with oil or a pressurized gas, e.g. sulphur hexafluoride ($SF_6$). The length of insulator 12 can be reduced in this case. The reduction proportion in the case of the gas is approximately a factor of 10. However, although this solution is superficially attractive, it requires means which ensure a perfect seal, also with respect to the measuring head. All the holes must be sealed, which make the construction of the device according to the invention more complex and onerous.

According to another not shown variant, the optical fibres can be held in a tube of insulating material.

Finally, the assembly can be moulded in the same way as described for the measuring head from an epoxy resin, which fills the interior of the axial channel 120 and seals the optical fibres.

Although a single turn of the optical fibre surrounding cable 2 would be sufficient for the Faraday effect to occur, it is necessary that the polarization state is maintained in a completely satisfactory manner all along the optical fibre 1. However, no optical fibre maintains this polarization state intact, particularly in applications of the invention where the distance separating the main conductor, i.e. line 2, from the reference winding 8 is particularly large, unless the optical fibre length is equal to twice the length of the indulating support 13.

In this case, the aforementioned formulas 1 and 2 respectively become:

$$\Delta\phi_1 = KmqI \quad \text{(1 bis)}$$

$$\Delta\phi_2 = K'pni \quad \text{(2 bis)}$$

with $K \neq K'$

Thus, in a preferred variant and according to an advantageous concept of the invention, special measures are taken to counteract this parasitic effect. Thus, the polarization drift is reduced by effecting a spatial mean on the evolution of the polarization.

For this purpose and in a preferred manner, the interferometer fibre 1 is arranged in accordance with the following wiring diagram;
(a) starting from interferometer core,
(b) rise up to measuring head 12 through channel 130 of insulator 13,
(c) passage round cable 2, which corresponds to one optical fibre turn,
(d) drop down to base 14,
(e) coiling of n turns on to the feedback coil,
(f) repetition of stages (b), (c), (d) and (e) m times,
(g) return to interferometer core.

Hereinbefore, the start from the interferometer core takes place at end 5 of the optical integrated circuit 4, when using the configuration of FIG. 1, and the return takes place to end 6. In a preferred manner and as has been stated hereinbefore, the interferometer core is located in the base 14 of the device.

Figure 8:
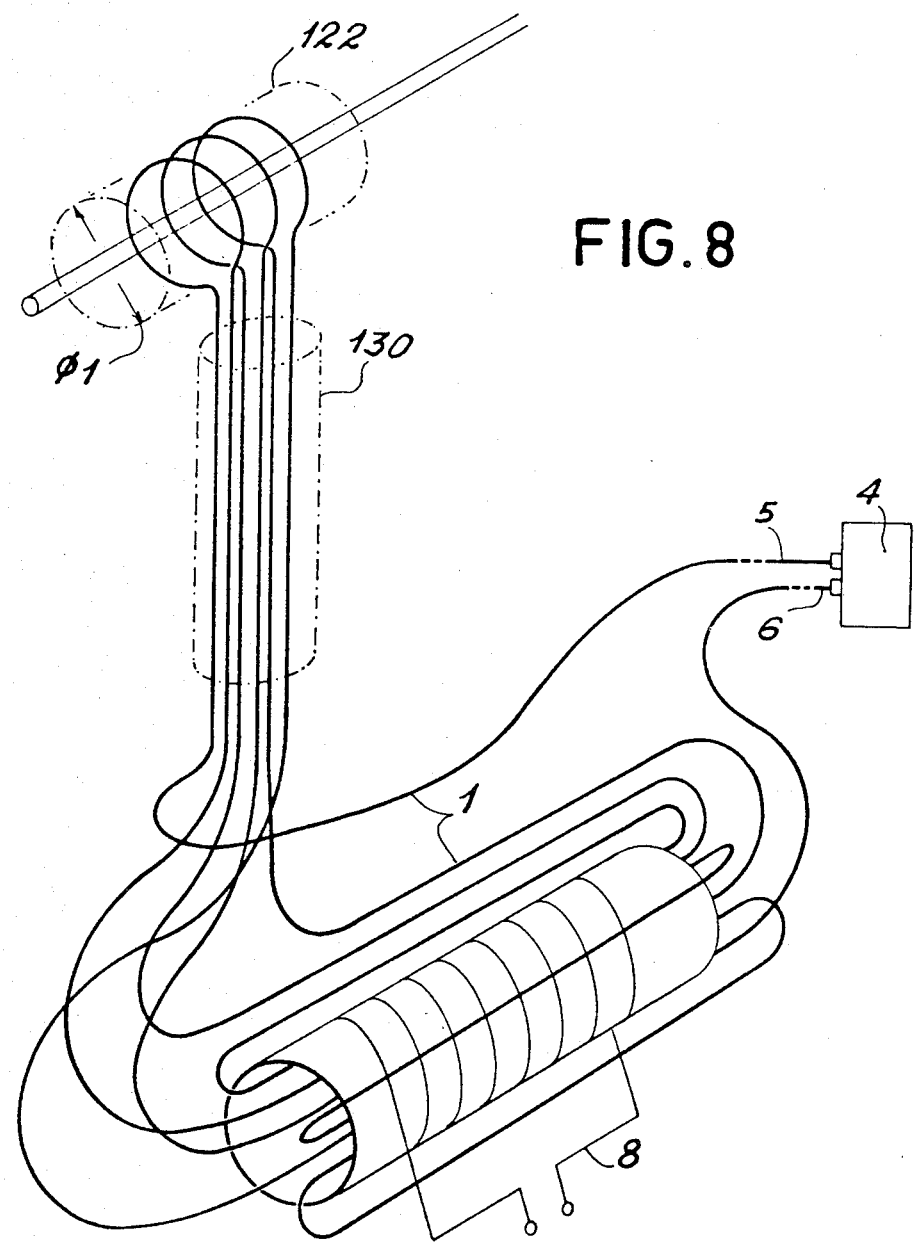

FIG. 8 illustrates a simplified form of the wiring in which $m=3$ and $n=2$. If the feedback coil 8 has p electric wire turns, the reduction factor of the transducer is $(I/i) = n \cdot p$ (independent of m).

The sensitivity of the transducer zero obeys the relation:

$$(\Delta\phi/\Delta I) = m \cdot 10^{-5} A$$

Apart from use in the measurement of current in the strict sense of the term, the device according to the invention can also be used in protecting against overloads. In this case, using simple known electronic circuits, a signal is supplied when the intensity exceeds a predetermined amplitude value and is used for setting off safety devices.

In the first concept of the device according to the invention described hereinbefore, the insulator fulfils the three functions of protecting and insulating the passage of information from a high potential region to an earth potential region (base 14), mechanically supports the actual device contained in the head and mechanically supports the portion of the line 2 or bar located on either side of the measuring head 12 if the device is self-supporting. In all cases, line 2 and support 13 are exposed to prejudicial environmental effects, e.g. gusts of wind, so that stresses and strains are exerted on support 13. However, the useful element in the measuring head 12, which is essentially constituted by optical fibre turns and a mandrel on which these turns are formed is reduced to a few grams, to which can be added the limited weight of the casing of the measuring head 12. The considerable weight and large dimensions of the insulating support 13 are necessary as a result of the fact that it must fulfil a function which is not connected with the actual measurement.

A second concept of the device according to the invention will now be described. Whilst retaining the general structure described hereinbefore, together with the advantages associated therewith, it aims at obviating the residual disadvantages by considerably simplifying the insulation system thereby reducing its size and cost and making its use easier.

The arrangements retained within the scope of the invention will now be described in greater detail relative to FIGS. 9 and 10.

Figure 9:
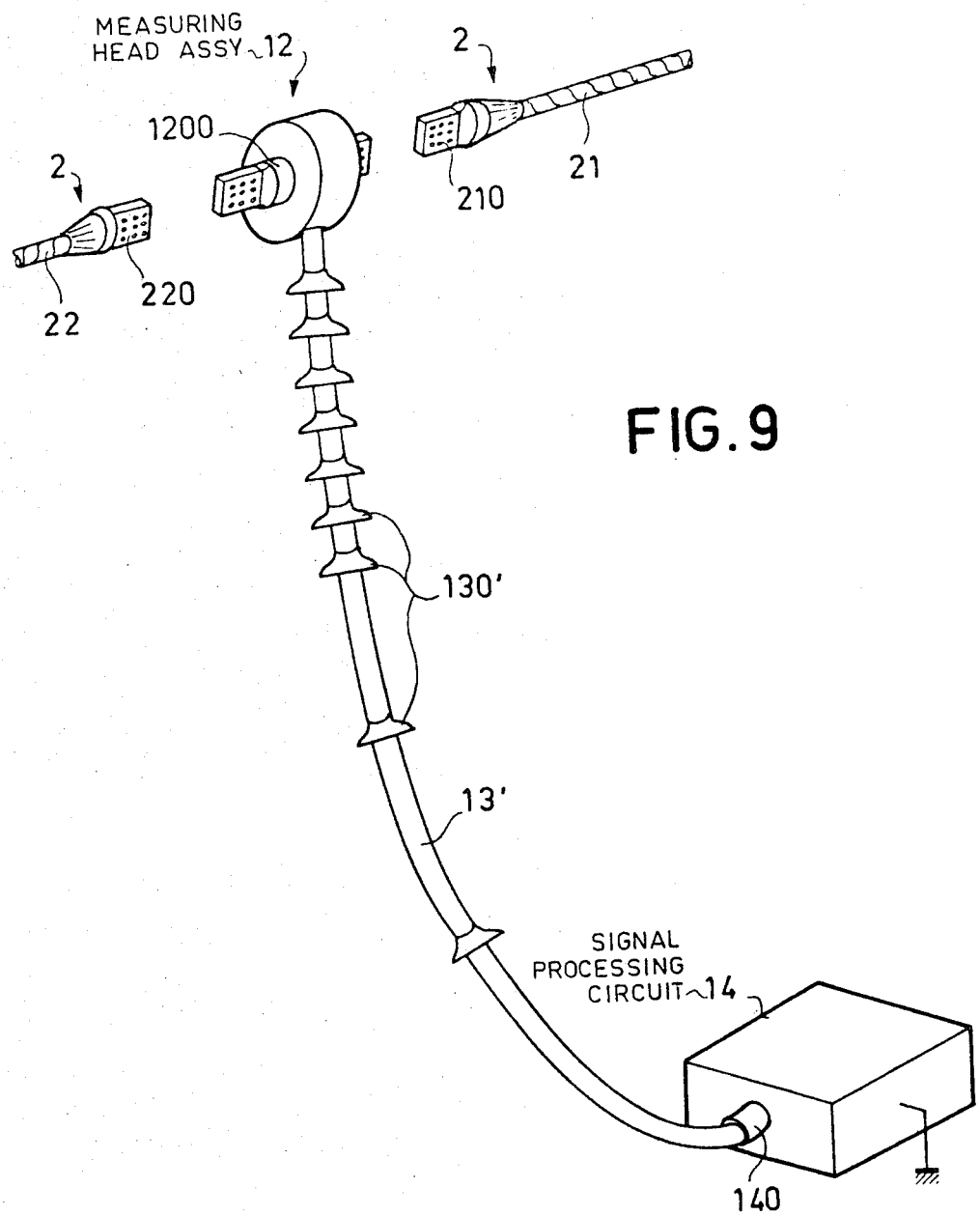
FIGS. 9 and 10 a specific embodiment of a measuring device according to a second concept of the invention.

FIG. 9 is an overall view of the measuring device according to the invention. As hereinbefore, it comprises three or four parts, depending on whether or not the electronic circuits are integrated into base 14. The latter is of the same nature as that described relative to FIG. 4. However, as will be explained hereinafter, its size can be considerably reduced, because the base no longer has to support a heavy, voluminous insulating support.

The main difference is due to the fact that the rigid support 13 of FIG. 4 is replaced by a tubular member 13' having a tubular wall, e.g. made from an elastomer material, which may optionally be reinforced by fibres of a dielectric material. These fibres can be of glass, silica or plastic, or can be based on a combination thereof. This tubular member protects the beam constituted by outward and return travels of fibre 1. In a preferred manner, the cavity formed by the inner conduit of the tube is filled with an insulating material. This insulating material can be a gas, e.g. sulphur hexafluoride (SF$_6$), a liquid, e.g. a conventional insulating oil in gel form, e.g. an insulating grease or silicone gel, or solid and elastic, e.g. another elastomer or rubber. This arrangement has the advantages of better securing optical fibre 1 in the case of insulating materials of the gel or solid elastic type, whilst increasing insulation in all cases.

Finally, and in a preferred manner, the insulating tubular member 13' is provided with skirts 130' having a so-called "water droplet" profile, which can be manufactured at the same time or can be joined subsequently. These skirts can then be made from the same elastomer material as member 13', or from some other insulating material, e.g. porcelain. Their function is to increase the length of the leakage path and to ensure the necessary insulation even under unfavourable conditions, e.g. rain. All or part of the length of the member 13' can be provided with skirts 130' and their distribution can be uniform or non-uniform. In the latter case, illustrated in FIG. 3, the maximum density of the skirts 130' can be in the vicinity of the measuring head, which is at the potential of the electrical line.

The arrangement described hereinbefore can be further improved. Instead of being equipped with separate skirts, the insulating member 13' can be provided with a single skirt 1300 round the helical insulating member, as illustrated in FIG. 5. The outer edge can have a "water droplet" profile. The assembly can be easily manufactured in a single operation, e.g. by extruding.

The flexible insulating member 13' is connected to base 140 by any appropriate fixing means in the form of a collar 140 in FIG. 3. In a specific constructional embodiment, the insulating member length can be approximately 8 m for an electrical line at a height of 5 m.

It is apparent that the flexibility of the tubular insulating member 13' makes it possible to adapt to the movements of the electrical lines, with restraining them. Moreover, base 14 can be located at a random point and as desired by the users of the device, so that it is no longer necessary to place it underneath the line. The only constraint is that the distance separating it from the electrical line must exceed the insulation distance in air.

Although the measuring head 2 can be of the same type described relative to FIG. 4, it is also possible as a result of the arrangements retained here, to improve its structure, whilst reducing its weight and dimensions.

Figure 10:
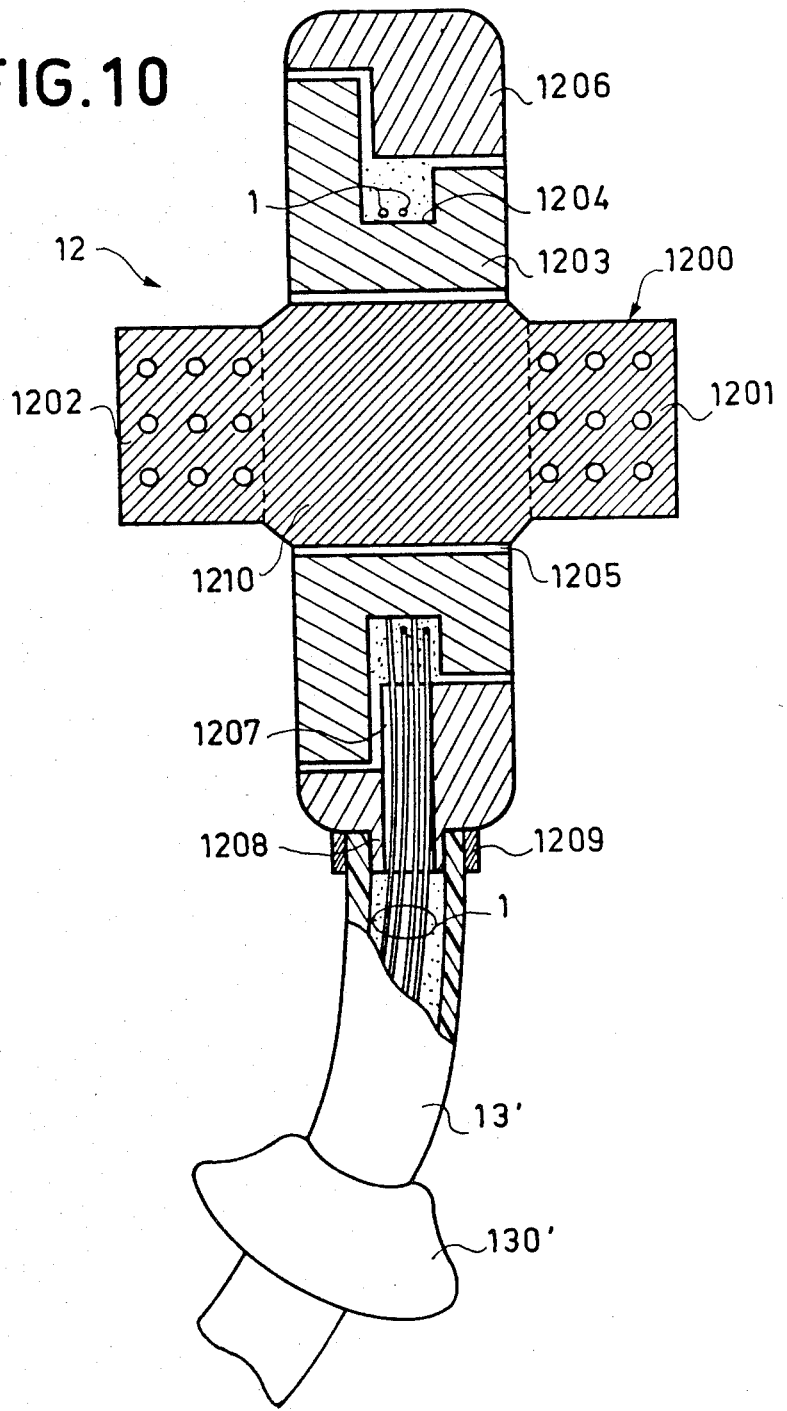

According to a preferred variant, this measuring head 2, illustrated in sectional form in FIG. 10, has a very short conducting bar element 1200. This bar, which has for example a circular section in its central part 1210 on which are placed the other elements of the measuring head, has a typical length of approximately 50 mm and a diameter of 125 mm for said central part and is extended by two planar connecting portions 1201, 1202, which are bolted to the corresponding parts 210 and 220 of the upstream and downstream terminations of the high voltage line 2. Portions 1201, 1202 are provided with holes for receiving the threaded rods used for bolting purposes, their number and diameter being determined by the physical characteristic of the line to be connected.

The conducting bar 1200 supports a toroidal member, made from an insulating (e.g. epoxy resin or polytetrafluorethylene) or non-insulating material and is constituted by two half-shells, which are fitted into one another, i.e. 1203 and 1206 respectively. The first half-shell 1203 has an annular groove 1204 serving as a mandrel for the turns of optical fibre 1 around the electrical circuit in which flows the current to be measured, i.e. bar 1200 in the embodiment illustrated in FIG. 4.

The second half-shell 1206 has a radial channel 1207 for establishing a link between the flexible walled, tubular insulating member 13' and annular groove 1204.

The outer hole of the channel is extended by a flange 1208 on to which is mounted the tubular member 13'. Fixing means 1209 of all appropriate types and shown in the form of a collar in FIG. 4 are also provided.

Thus, the assembly has the triple function of serving as a mandrel for winding the optical fibre, of protecting it against all mechanical damage and against the weather, as well as providing an attachment point for the flexible tubular member 13'. The two half-shells are fixed together by all appropriate means, e.g. bolting, welding, adhesion, etc.

In a preferred manner, the inner spaces which are left free, particularly the annular recess 1204, are filled with an insulating material, in the same way as has been described in connection with the insulating member 13'.

In order to make the representation of the essential elements of measuring head 12 more simple in FIG. 10, only two turns of the optical fibre 1 about conductive bar 1200 are shown. However, there can obviously be a random number of turns.

According to another, not shown variant, the head can be produced from a single shell, like shell 1203, which also has an annular groove in which are wound the turns of fibre 1. The head is then completed by a moulding, particularly by filling the groove with the aid of insulating material, which can be the same as that forming the single shell.

In a preferred manner, the twisting of the optical fibre 1 and the feedback winding are constructed in the manner described with reference to FIG. 8.

Although the cost and overall dimensions of the current measuring device have been considerably reduced by what has been described hereinbefore, it is possible to reduce them further when it is borne in mind that high voltage power is generally supplied in polyphase and particularly three-phase form. It is conventionally necessary to have the same number of measuring devices as there are currents to be measured, in view of the large spacing between the various high voltage lines carrying the polyphase current. The present invention makes it possible to combine the measuring devices.

Figure 12:
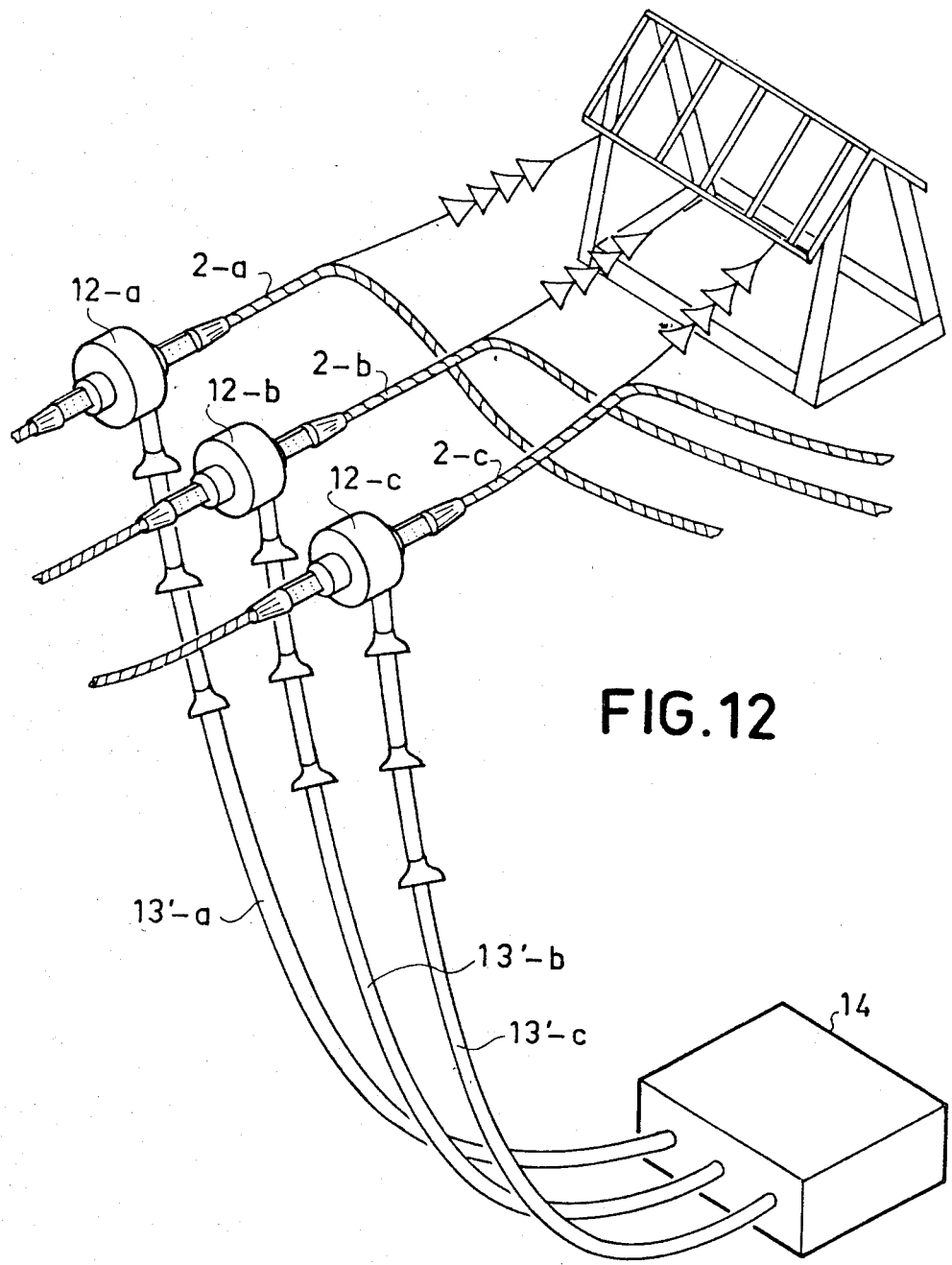

FIG. 12 illustrates a first such possibility with respect to the base 14 (and optionally electronic circuits 15 of FIG. 4 if they are separate from the base). This arrangement is in particular made possible by using flexible tubular insulating members.

FIG. 12 shows a three-phase current distribution with three high voltage cables 2a, 2b, 2c, corresponding to currents having arbitrarily designated phases a, b and c. On these three cables are connected in series the identical bars of the three measuring heads 12a, 12b and 12c, in the embodiment of FIG. 12, to the measuring head described relative to FIGS. 9 and 10. Three downleads between these heads and the single box of base 14 are provided by three identical flexible tubular insulating members 13'a, 13'b and 13'c respectively. This arrangement makes it possible to combine the not shown electronic circuits necessary for processing the signal supplied by the three interferometers, each associated with one of the three measuring heads 12a, 12b and 12c, as well as the circuits providing the power supply and specifically the feedback circuits (FIG. 1:8) of each interferometer. The three currents, one per interferometer, can be taken in simple manner from a single power supply.

However, the compactness of the device can be increased by combining part of the optical circuitry, as is illustrated in FIG. 13.

Figure 11:
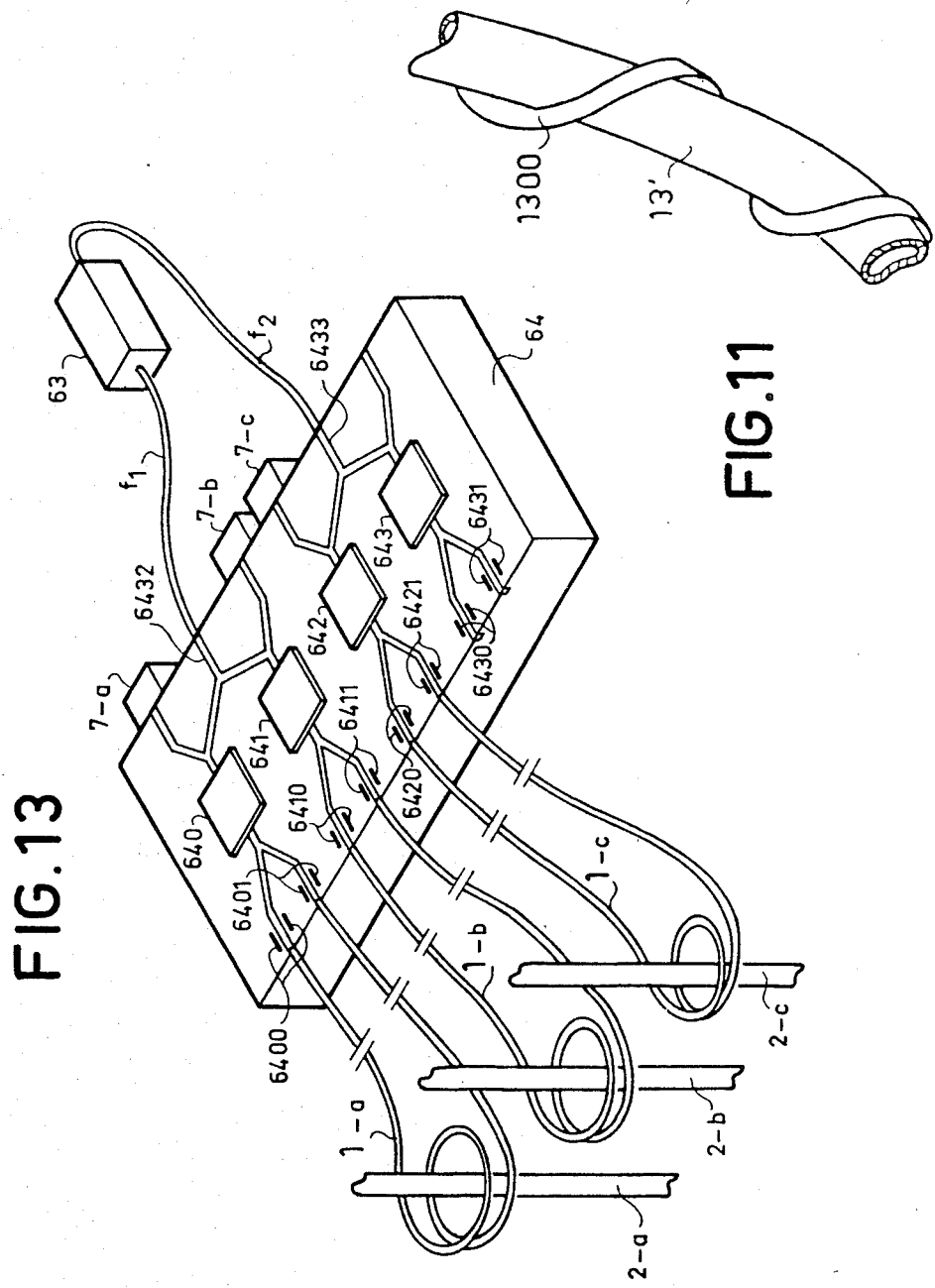
FIG. 11 a constructional detail of such a device.

For this purpose, the integrated circuit 4 of FIG. 1 is replaced by an integrated circuit having a common substrate on which there are at least three separation and recombination circuits, each being associated with an interferometer constituted by an optical fibre passing into one of the measuring heads 12a to 12c of FIG. 11. Although numerous integrated circuit types can be used, it is preferably realized in accordance with U.S. patent application Ser. No. 307,933, filed on Oct. 10th 1981 (corresponding to French Patent Application No. 2 492 116). As illustrated more particularly in FIGS. 2 and 6 thereof, the separation and recombination circuit is obtained by producing in the substrate, which can be a sheet made from lithium niobate ($L_iNbO_3$) of lithium tantalate ($L_iT_aO_3$), monomode light guides by the diffusion of metal ions (respectively of tantalum and niobium). In the envisaged application, each circuit comprises at least five branches, namely two input branches, two output branches and a central branch covered with a metal coating, the system being shaped like two head to tail Y's.

Moreover, at least one output branch is provided with a phase modulator identical to modulator 41 of FIG. 1. According to a preferred embodiment, each circuit is associated with two symmetrical modulators in accordance with U.S. patent application Ser. No. 213,216 of Dec. 5th 1980 (corresponding to French Patent Application No. 2 471 583) and as is more particularly illustrated by FIG. 15 thereof.

FIG. 13 shows a special configuration of four couplers 640 to 643, forming an integrated circuit 64 (which replaces the integrated circuit 4 of FIG. 1). Each coupler is associated with two modulators, respectively 6400-6401, 6410-6411, 6420-6421 and 6430-6431. Moreover, two contiguous couplers have a common input branch, respectively 6432 and 6433. This practice, but non-obligatory arrangement, permits an easier light energy supply of the two couplers and consequently of the two interferometers. When measuring three-phase currents, a coupler 643 remains available and can be used for other purposes or can be held in reserve.

The two common branches 6432 and 6433 are coupled, via two optical fibres $F_1$ and $F_2$ to a semiconductor laser source 63, one by the front face and the other by the rear face. As is known, this type of optoelectronic element emits by both faces.

The two output branches of each separation and recombination circuit are connected to the ends of the fibre forming the interferometer associated therewith, respectively 1a, 1b and 1c, forming at least one turn around these conductors (FIG. 6: 2a, 2b, 2c) in which circulate the currents to be measured.

Finally, the assembly is completed by detectors, respectively 7a, 7b and 7c, fulfilling an identical function to detector 7 of FIG. 1.

The necessary electrical circuits are the same as those described relative to FIG. 1.

They must be repeated three times and in more general terms x times when the number of different phases is x. Only circuit 11 is slightly modified, because it has to supply two control signals of the same frequency, but in phase opposition, for supplying the two associated modulators 6400 and 6401 in the case of the first interferometer (fibre 1a).

The invention is not limited to the embodiments described and shown and is applicable whenever it is necessary to measure currents carried by single phase or polyphase, a.c. or d.c., high voltage lines.

TABLE I

| High voltage line | |
|---|---|
| voltage | 400 kV |
| current | 63 kA |
| reduction factor | $10^5$ |
| feedback current | 630 mA |
| geometrical data | |
| n | 6 |
| m | 100 |
| p | 1000 |
| $\emptyset_1$ | 500 mm |
| insulating support length l | 5 m |
| total optical fibre length L | 500 m (approx.) |
| sensitivity $\Delta\phi/\Delta I$ | $10^{-4}$ rad.A$^{-1}$ (approx.) |
| optoelectronic components | |
| light source | transverse monomode GaAs laser diode |
| detector | PIN diode |

What is claimed is:

1. A device for measuring at least one current circulating in a high voltage power distribution line using at least one interferometric measuring means, comprising:
an optical fibre in which circulate two waves in opposite directions, the current to be measured inducing a first phase shift between the two waves emerging at the ends of the optical fibre by the Faraday effect;
optoelectronic circuits connected to said optical fibre supplying an electric control signal proportional to this phase shift; and
a reference current generator receiving said electric control signal and supplying a reference conductor circuit inducing by the Faraday effect a second phase shift between the two waves emerging at the ends of the optical fibre in the opposite direction to the first phase shift and, of amplitude such that the resulting phase shift is zero, the reference current value being directly proportional to the current to be measured;
wherein the improvement comprises an apparatus for each current to be measured, where each apparatus comprises:
a measuring head made from an insulating material and placed on a conductor through which the current to be measured flows;
an element made from an insulating material and perforated by a connecting channel, one of the ends of said channel issuing into the measuring head; and
an electrically grounded base incorporating said reference circuit and linked with the second end of the channel made in the insulating element:
wherein the optical fibre of each interferometric measuring means is disposed in such a way as to form at least one closed loop describing a path starting in the base, traversing the channel in a first direction, forming a turn around the conductor within the measuring head, passing through the channel again in the opposite direction and returning to the base in order to form at least one turn around the reference conductor circuit.

2. A device according to claim 1, wherein the measuring head comprises two joined half-shells made from an insulating material and containing a mandrel placed on the conductor traversed by the current to be measured and on to which is wound at least one turn of the optical fibre.

3. A device according to claim 1, wherein the measuring head is shaped like a cylinder, with an axis of symmetry parallel to the conductor traversed by the current to be measured and extended at both ends by two hemispheres.

4. A device according to claim 1, wherein the measuring head is shaped like a torus having an axis of symmetry parallel to the conductor traversed by the current to be measured.

5. A device according to claim 1, wherein the conductor traversed by the current to be measured is constituted by the power distribution line.

6. A device according to claim 1, wherein the conductor traversed by the current to be measured is constituted by a bar of electricity-conducting material, integral with the measuring head and having fixing means permitting its insertion in series into the power distribution line.

7. A device according to claim 1, wherein the insulating member is constituted by a frustum-shaped member, parallel to the said given height, and has a pile of skirts made from the same insulating material and having rounded "water droplet" external profiles, and wherein the given length exceeds the bending distance for said potential.

8. A device according to claim 1, wherein the insulating member is a tubular member having a flexible wall, fixed by one of its ends to the measuring head associated therewith and by its other end to the base.

9. A device according to claim 8, wherein the material forming the wall is an elastomer.

10. A device according to claim 8, wherein the wall is reinforced by the inclusion of dielectric material fibres.

11. A device according to claim 8, wherein the tubular insulating member with a flexible wall is provided with skirts made from an insulating material and having rounded external profiles in the form of "water droplets" and mounted thereon.

12. A device according to claim 8, wherein the tubular insulating member with a flexible wall is provided with a single skirt of an insulating material, arranged in helical manner around said member and wherein the external profile of said helical skirt is rounded in the form of "water droplets".

13. A device according to claim 12, wherein the insulating material is either porcelain or an elastomer.

14. A device according to claim 8, wherein each measuring head has a bar made from a conductive material, extended at each end by a planar member, provided with connection means, so that it can be inserted in series with a line in which flows the current to be measured and a torus mounted on said bar, and wherein the torus is provided with an internal annular groove into which is wound at least one turn of the optical fibre and communicating by a radial channel with the flexible walled tubular insulating member, said radial channel being extended by a flange, on to which is mounted the insulating tubular member.

15. A device according to claim 14, wherein the torus is made from epoxy resin.

16. A device according to claim 14, wherein the channel of the flexible walled insulating tubular member and the annular groove are filled with an insulating material chosen from insulating gel, a solid elastic, oil or sulphur hexafluoride under a pressure which is higher than atmospheric pressure.

17. A device according to claim 8, wherein the power distribution is by polyphase currents carried by the lines and it comprises an interferometer having an optical fibre and a measuring head associated with each line and measuring the current carried by said line, as well as a common base and flexible walled tubular insulating members, connecting each of the measuring heads to the common base, the optical fibre of the interferometer associated with the head passing through the tubular insulating member at least once in each direction, connection being such that said fibre forms at least one turn around the associated line.

18. A device according to claim 17, wherein the ends of the fibre constituting each interferometer are connected to separation and recombination means, the waves emerging from the two ends of the optical fibre by two output branches, and wherein the separation and recombination means are in the form of optical circuits integrated on a common substrate, said means also having in each case two input branches, one of these branches being coupled to individual optoelectronic circuits and the other to a common light energy source, whilst there are also two phase modulators supplied by signals in phase opposition, each associated with one of the two output branches.

19. A device according to claim 18, wherein the input branches of the two separation and recombination means are contiguous on the said common substrate and form a common frustum, and wherein the common energy source is constituted by a semiconductor laser, each common frustum being optically coupled to one of the front or rear emissive faces of the laser by an optical fibre.

20. A device according to claim 17, wherein the electrical power distribution takes place by three lines carrying three-phase currents.

21. A device according to claim 1, wherein the optical fibre describes m times a path starting in the base, traversing the channel of the support, forming a turn around the conductor within the measuring head, passes through the channel in the opposite direction and forms n turns around the reference circuit, n and m being integers differing from zero.

22. The device according to claim 1 wherein said two waves have a polarization and wherein the disposition of said optical fibre does not disturb said polarization.

* * * * *